United States Patent [19]

Rosenbaum

[11] 4,350,959

[45] Sep. 21, 1982

[54] FEEDBACK SIGNAL AMPLIFIER

[75] Inventor: Erik Rosenbaum, Woodbine, Md.

[73] Assignee: The United States of America as represented by the Secretary of the Navy, Washington, D.C.

[21] Appl. No.: 140,034

[22] Filed: Apr. 14, 1980

[51] Int. Cl.³ .............................................. H03F 1/34
[52] U.S. Cl. ...................................... 330/110; 330/86
[58] Field of Search ........................... 330/86, 110, 282

[56] References Cited

U.S. PATENT DOCUMENTS 4,100,596  7/1978  Olafson et al. ...................... 363/148

FOREIGN PATENT DOCUMENTS 1804389  7/1970  Fed. Rep. of Germany ...... 330/110

*Primary Examiner*—James B. Mullins
*Assistant Examiner*—Gene Wan
*Attorney, Agent, or Firm*—R. F. Beers; W. T. Skeer

[57] ABSTRACT

A feedback signal amplifier circuit having switchable closed loop gain in response to the output signal level of the amplifier for limiting the output signal level is presented. The feedback ratio of the circuit is switched by output signal level responsive diodes which derive signal level determining bias from both an unregulated power supply and the output terminal of the amplifier. A bias compensation network deriving bias from the unregulated power supply is connected to a bias sensitive input of the amplifier for tracking changes in power supply voltage which are reflected into the output of the amplifier for keeping the signal level determining bias of the diodes essentially constant and independent of changes of power supply voltage.

7 Claims, 1 Drawing Figure

FEEDBACK SIGNAL AMPLIFIER

BACKGROUND OF THE INVENTION

The present invention relates to signal feedback amplifiers, and more particularly, to feedback amplifiers wherein the closed loop gain of the amplifier circuit is changeable for limiting the output signal voltage independent of power supply voltage levels.

It is often desirable to provide a signal amplifier having a limiting action for preventing overloading of successive stages and the like. In such cases, it is desirable that the limiting be accomplished reliably and economically without introducing appreciable distortion into the signal.

In signal limiting amplifiers, it is desirable that the predetermined limit of output signal of the amplifier remain constant. Often such amplifiers require a regulated power supply for keeping the amplifier limiting threshold constant. Accordingly, it is desirable to provide a signal limiting amplifier wherein the gain and limiting signal levels are independent of power supply voltage.

SUMMARY OF THE INVENTION

Briefly, the present invention comprises a signal amplifier circuit having a plurality of gain values selectable in response to the output signal level of the amplifier and connectable to a power supply having a variable output. A feedback network is connected around an operational amplifier thereby providing a first closed loop gain for the amplifier circuit. A diode network is connected to the output of the amplifier for receiving the output signal therefrom and, when the signal level of the output of the amplifier, as determined by a biasing network for the diodes connected across the power supply, exceeds a predetermined value, the diodes are turned into conduction thereby connecting a second resistive feedback network into the amplifier circuit and reducing the gain of the amplifier circuit to a second closed loop gain level. A bias compensation circuit is connected to the power supply and an input terminal of the amplifier so that any changes in the bias of the diodes will also be applied at a bias input to the amplifier and be reflected as a change in the bias at the output of the amplifier in a manner to track and cancel any change of bias at the diodes thereby maintaining the predetermined signal switching level constant and independent of power supply variation.

OBJECTS OF THE INVENTION

With reference to the Background of the Invention hereinabove, accordingly, it is an object of the present invention to provide a signal amplifier circuit wherein the gain and signal levels of the limiting amplifier are independent of power supply voltage. It is another object of the present invention to provide a signal amplifying limiter circuit wherein the signal level reference is derived from bias derived from power supply and, tracking means are provided to compensate for and cancel out changes in the bias due to changes in power supply voltage. Still another object of the present invention is to provide a feedback amplifier circuit wherein the feedback ratio is changeable in response to the signal level output of the amplifier. Other objects and advantages of the present invention will become apparent to those skilled in the art from the following description of the preferred embodiment of the invention and the novel features particularly pointed hereinafter in connection with the appended claims.

BRIEF DESCRIPTION OF THE DRAWING

Reference is now made to the following drawing wherein.

DESCRIPTION OF THE PREFERRED EMBODIMENT

Figure 1:
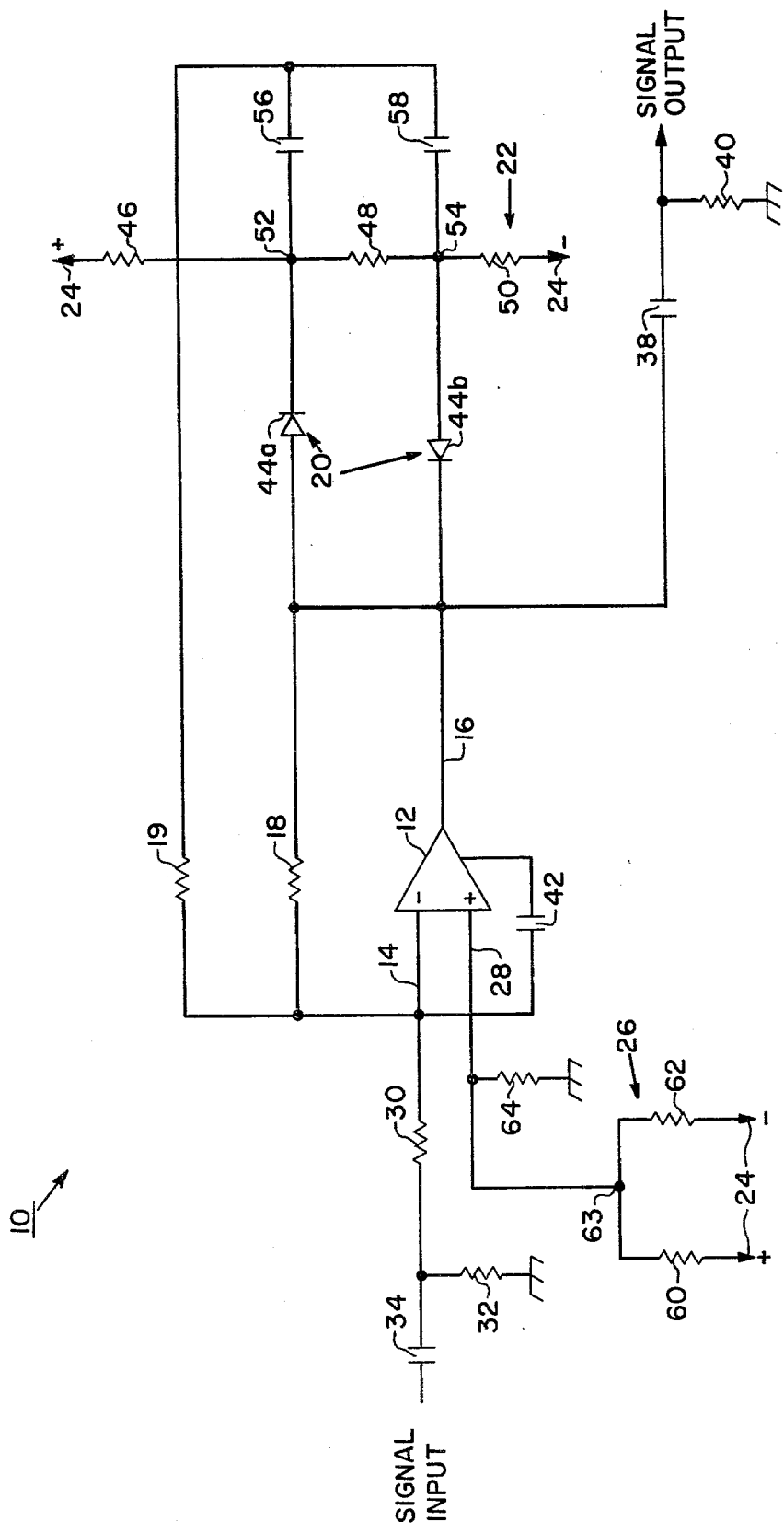
FIG. 1 is a schematic of an amplifier circuit showing one embodiment of the present invention.

Referring now to the accompanying drawing, in which like reference numerals designate like parts throughout, FIG. 1 shows the amplifier circuit, generally designated 10, comprising an amplifier 12 having a first input terminal 14, an output terminal 16, and a feedback resistor 18 connected between output terminal 16 and input terminal 14. At a predetermined signal level present at output terminal 16, feedback resistor 19 is connected to output terminal 16 by switching circuit 20 which derives operational bias from a first bias network, generally designated 22, connected across a power supply 24 having a variable output voltage. Upon switching feedback resistor 19 into the circuit, the feedback of the circuit is increased and the closed loop gain is decreased thereby limiting the voltage output attainable at the output terminal 16 without increasing distortion of the signal waveform. A second bias network, generally designated 26, is connected across power supply 24 and to a second input terminal 28 of amplifier 12. Power supply variations appearing at first bias network 22 also appear at second bias network 26 which variations fed into the input 28 are manifested at output terminal 16 such that bias changes applied to circuit 20 are tracked and compensated for at output terminal 16 to substantially cancel any bias voltage changes that would occur across circuit 20 due to first bias network 22.

More particularly, amplifier 12 of the present embodiment is an integrated circuit operational amplifier commercially available as a LM 101. However, other amplification means such as other integrated or discrete amplifiers having sufficient gain could be used. Inputs 14 and 28 are the conventional inputs for an operational amplifier and the negative sign adjacent input 14 and the positive sign adjacent input 28 indicate the polarity of signal required for a positive output.

Amplifier 12 has a large open loop gain, typically at least 10,000. In the present embodiment, input resistors 30 and 32 and input capacitor 34, in conjunction with feedback resistor 18 form a first feedback network having a first feedback ratio for reducing the open circuit gain of amplifier 12 to a first closed loop gain. As the signal level at input terminal 14 increases, the output signal level present at output terminal 16 across the output coupling capacitor 38 and output load resistor 40, also increases, the frequency compensating capacitor 42 being provided for high frequency stability of a circuit.

Switching circuit 20, in the present embodiment, comprises diodes 44A, B biased by first bias network 22. Diodes 44A, B are connected in series at a common junction connected to output terminal 16. The cathode of diode 44A is connected to resistor 46 which in turn is connected to the positive terminal of the power supply 24. Resistor 48 is connected from the junction of diode 44A and resistor 46 to the anode of diode 44B. Resistor 50 is connected from the junction of resistor 48 and diode 44B to the negative terminal of power supply 24. Current through first bias network 22, i.e., resistors 46, 48, and 50, generates a bias voltage across resistor 48 reverse biasing diodes 44A, B. A nominal bias voltage is provided at output 16 from amplifier 12 and the bias voltage across resistor 48 is selected such that the average voltage at junctions 52, 54 (the sum of the voltages at the junctions divided by 2) equals the bias voltage present at output terminal 16. In this manner, the reverse bias voltage applied to each of diodes 44A, B, is equal, i.e., respectively the voltage differential between the voltage at junction 52 and output terminal 16, and the voltage at terminal 16 and junction 54. In the reverse bias condition, diodes 44A, B will not conduct and feedback resistor 19 is not connected to output terminal 16. The bias voltage across each of diodes 44A, B presents a threshold conduction voltage above which forward bias provided by the signal at output terminal 16 must overcome in order to turn respective diodes 44A, B into conduction and connect resistor 18. When the respective peak level of the signal present at output terminal 16 exceeds the reverse bias voltage across diodes 44A, B in addition to the internal threshold of conduction voltage for the respective diodes, which for silicon typically is 0.6 volts, diodes 44A, B become conductive and the signal is transmitted through their respective coupling capacitors 56 and 58 to feedback resistor 19 thereby connecting feedback resistor 19 in parallel with feedback resistor 18 changing the amount of feedback and feedback ratio of circuit 10, and the closed loop gain of circuit 10 to a second closed loop gain value.

It is within the contemplation of the present invention, that electronic components other than diodes can be used as switching members 20, e.g. zener diodes, SCR's, transistors, and the like with their respective gate terminals being wired and biased to switch the signal at output 16 at threshold signal level and connect feedback resistor 19 into the circuit as described above. The feedback ratio as shown in the exemplary embodiment comprises individual resistors wired into the circuit, but these resistors can be representative of resistance networks which are their equivalents and would determine the respective feedback ratios shown. Additionally, the bias voltage between junctions 52, 54 can be made adjustable depending upon circuit requirements.

In the exemplary embodiment, feedback resistor 19 is connected by switching circuit 20 to increase feedback of circuit 10. It is within the contemplation of the present invention that feedback resistor 19 or equivalent feedback network can be connected to noninverting input 28 of amplifier 12 thereby increasing the closed loop gain of the amplifier circuit 10. It is also further within the contemplation of the present invention that a plurality of switching networks 20 can be utilized, each being biased at different voltage levels such that there can be a plurality of limiting voltages switched in seriatum according to the signal level present at output terminal 16 for providing additional limiting.

In the exemplary embodiment, the nominal bias for the junction of diodes 44A, B is provided at signal output terminal 16. It is further within the contemplation of the present invention that the nominal bias for the diodes be provided by a separate bias output terminal from amplifier 12 coupled to diodes 44A, B independent of signal output terminal 16.

Since first bias network 22 is connected across an unregulated power supply, changes in the current of voltage divider 46, 48, 50 will change the voltage across resistor 48 and bias on diodes 44A, B. This change of bias will result in uneven conduction of the respective diodes, i.e., one diode would conduct for a longer period than the other. The uneven conduction and limiting of diodes 44A, B would cause increased distortion of the output signal across resistor 40. In order to prevent this distortion and maintain bi-lateral symmetrical signal conduction of the diodes 44A, B, second bias network 26 is used. Resistors 60 and 62 are connected in series across the same power supply as first bias network 22 with junction 63 of the resistors 60 and 62 being connected to second input 28 of amplifier 12 and resistor 64 serving as part of second bias network 26 as well as circuit requirements of operational amplifier 12. Noninverting input 28 is provided with DC bias provided by second bias network 26 and this bias voltage is reflected at output terminal 16 or separate output bias output terminal of the amplifier as appropriate. If the output of power supply 24 across first bias network 22 changes, an equal change appears across second bias network 26 with a proportional change being applied to terminal 28 through second bias network 26. The change of the bias voltage, i.e., $\Delta V$, applied to terminal 28, is reflected to the bias at output terminal 16 to track and compensate for any bias change applied to diodes 44A, B through first bias providing network 22. In this manner, the bias provided at terminal 16 moves up or down an amount necessary to compensate for changes of bias of bias network 22. Thus, the signal switching level at output terminal 16 of diodes 44A, B remains constant and independent of the output voltage of power supply 24.

Thus, herein is disclosed a signal amplifier circuit having a plurality of closed loop gain values selectable in response to the output signal level of the amplifier by signal level sensitive switching members for limiting the output signal level of the amplifier. A bias network determining the switching level of the output signal is provided and derives the first bias voltage from a power supply having a variable output. A compensating bias network connected across the power supply is connected to a bias sensitive input of the amplifier to change the bias voltage applied to the signal level sensitive switching members by the amplifier for keeping the bias applied to the switching members constant by tracking and compensating for changes in the first bias voltage.

It is understood that the foregoing disclosure relates to a preferred embodiment of the present invention and that numerous modifications or alterations may occur to those skilled in the art without departing from the spirit and scope of the invention as set forth in the appended claims.

What is claimed and desired to be secured by letters patent is:

1. A circuit comprising:
   a power supply;
   an operational amplifier having first and second inputs and an output,
   a signal coupling circuit connected to said first input of said operational amplifier;
   a first feedback resistor connected to said first input and to the output of said operational amplifier,
   a second feedback resistor connected to said first input of said operational amplifier and connected to said output via a pair of capacitors and a pair of diode switches, the diodes being in circuit in opposite polarity and each diode being connected in series with one of said capacitors;

a first bias network connecting said power supply with said pair of diodes to determine the operation potential of each diode; and a second bias network connected between said power supply and said second input, whereby the gain of said operational amplifier is varied between two values as determined by said first and second feedback resistors and is unaffected by variations in the output of said power supply.

2. A circuit according to claim 1 wherein said signal coupling means includes a resistor connected between said first input and ground such that the feedback ratios are determined thereby.

3. A circuit according to claim 1 wherein said first bias network includes a resistor connected between said pair of diodes.

4. A circuit according to claim 1 wherein said second bias network includes a "Y" network of resistors with said second input connected to the junction thereof.

5. A circuit according to claim 2 wherein said first bias network includes a resistor connected between said pair of diodes.

6. A circuit according to claim 3 wherein said second bias network includes a "Y" network of resistors with said second input connected to the junction thereof.

7. A circuit according to claim 5 wherein said second bias network includes a "Y" network of resistors with said second input connected to the junction thereof.

* * * * *